(12) United States Patent
Hum et al.

(10) Patent No.: US 7,095,342 B1
(45) Date of Patent: Aug. 22, 2006

(54) COMPRESSING MICROCODE

(75) Inventors: Herbert Hum, Portland, OR (US);
Mauricio Breternitz, Jr., Austin, TX (US); Youfeng Wu, Palo Alto, CA (US); Sangwook Kim, Austin, TX (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/096,152

(22) Filed: Mar. 31, 2005

(51) Int. Cl.
*H03M 7/40* (2006.01)

(52) U.S. Cl. .................................... 341/67; 341/51
(58) Field of Classification Search ............ 341/50–70, 341/87, 102, 106; 714/42, 718
See application file for complete search history.

(56) References Cited

U.S. PATENT DOCUMENTS

| | | | | |
|---|---|---|---|---|
| 4,495,563 A | * | 1/1985 | McDonough | 712/42 |
| 4,870,662 A | * | 9/1989 | Lindbergh et al. | 341/67 |
| 5,067,776 A | * | 11/1991 | Aderer | 301/9.2 |
| 5,138,316 A | * | 8/1992 | Konishi | 341/67 |
| 5,764,994 A | | 6/1998 | Craft | 395/709 |
| 6,611,213 B1 | * | 8/2003 | Bentley et al. | 341/67 |
| 6,834,361 B1 | * | 12/2004 | Abbott | 714/42 |

OTHER PUBLICATIONS

Ros, Montserrat; Peter Sutton. "A Hamming Distance Based VLIW/EPIC Code Compression Technique" The University of Queensland; CASES '04, Sep. 23-25, 2004.
U.S. Appl. No. 11/020,481, filed Dec. 22, 2004, entitled "Method and System For Reducing Program Code Size" by Youfeng Wu and Mauricio Breternitz, Jr.
U.S. Appl. No. 11/020,340, filed Dec. 22, 2004, entitled "Method and System For Reducing Program code Size" by Youfeng Wu and Mauricio Breternitz, Jr.

* cited by examiner

*Primary Examiner*—Lam T. Mai
(74) *Attorney, Agent, or Firm*—Trop, Pruner & Hu, P.C.

(57) ABSTRACT

In one embodiment, the present invention includes a method to compress data stored in a memory to reduce size and power consumption. The method includes segmenting each word of a code portion into multiple fields, forming tables having unique entries for each of the fields, and assigning a pointer to each of the unique entries in each of the tables. Other embodiments are described and claimed.

29 Claims, 5 Drawing Sheets

COMPRESSING MICROCODE

BACKGROUND

The present invention relates to memory technology, and more particularly to memories used in processor-based systems.

Many current processors include one or more memories integrated into the processor. Such memories include cache structures, which are typically formed of static random access memory (SRAM), as well as read only memories (ROMs) such as microcode. Microcode is a way of using programmability of microarchitectural components to enhance functionality, and to apply updates to an existing design (e.g., a processor design). In such manner, die area, power consumption and design cost may be kept under control.

Recent trends have migrated more advanced functionality to microcode of a processor core. Many processor designs include thousands of lines of microcode, and microcode storage can consume up to 20% of the die area of a processor. Microcode bloat increases costs in terms of die area and associated power consumption. The cost for microcode storage is especially acute where small footprint dies and reduced power consumption are required, such as in processors used in embedded applications.

A need thus exists to provide for microcode storage with reduced size and power consumption.

DETAILED DESCRIPTION

In various embodiments, die area cost associated with a memory such as that used for microcode storage may be reduced by application of a compressing transformation. That is, data (e.g., instructions forming microcode) may be stored in a transformed (i.e., compressed) representation and be decompressed during execution. In such manner, savings in microstore static size may be realized. For example, a read only memory (ROM) may be compressed to aid in reducing memory size and power consumption. Particular embodiments may be used in a microcode ROM (UROM) to reduce the size and power consumption of the ROM.

Microcode typically includes a number of microcode words, each having different operational fields. To enhance performance, a multiple-level organization for a compressed microcode structure may be provided. First, a set of unique bit patterns that compose the microcode words may be identified and stored in one or more tables of a memory. A separate array of the memory includes pointers into such tables. In such manner, pipelining which hides the performance impact of compression of the initial access to microcode ROM for long microcode sequences may be used, and fixed-sized pointers may be implemented which facilitate and simplify decompression hardware. Still further, in some embodiments, each microcode word may be split into fields such that the number of unique patterns for each field is minimized.

Figure 1:
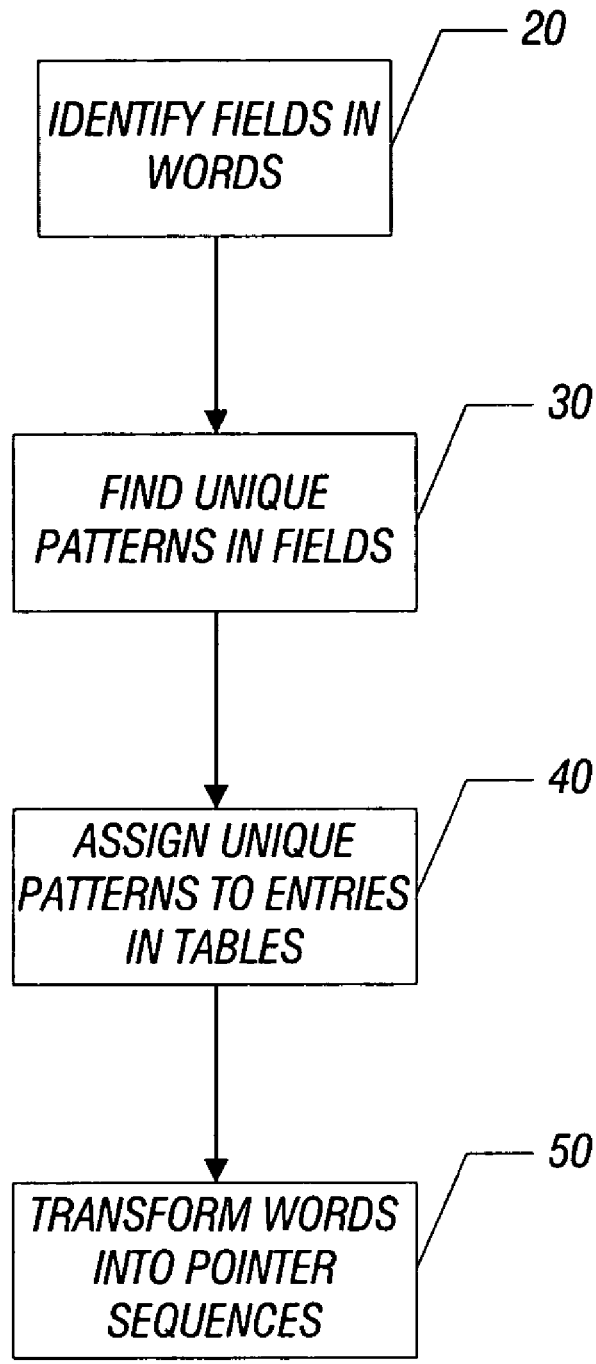
FIG. 1 is a flow diagram of a method in accordance with one embodiment of the present invention.

Referring now to FIG. 1, shown is a flow diagram of a method in accordance with one embodiment of the present invention. As shown in FIG. 1, method 10 may be used to build a compressed memory structure. Method 10 may begin by identifying fields within words to be stored in the memory (block 20). For example, in an embodiment for microcode storage, the microcode first may be analyzed to determine one or more appropriate fields in which to segment microcode words. As an example, microcode words may be segmented by operational fields including, for example, opcode, source and destination arguments, and immediate values. However, in other embodiments the words need not be segmented into fields. As used herein the terms "word" or "words" are used to denote a collection of data bits generically, and not necessarily a collection of a particular size.

Then, the different fields may be analyzed to find unique patterns within the fields (block 30). That is, the corresponding fields of every word may be analyzed to develop a list of unique patterns for the field. Microcode contains patterns. Many common operations are expressed by sequences of opcodes, utilizing distinct source and/or destination registers. Thus a field corresponding to opcodes may have common entries. For reference, an example embodiment having microoperands (UOPs) of 71 bits was separated in two fields, respectively of 35 and 36 bits. While there were 13739 unique bit patterns of 71 bits in the entire microcode program, there were only 2396 unique bit patterns in the first 35 bits, and only 8436 in the last 36 bits.

Next, the unique pattern list for each of the fields may be assigned to entries in a corresponding table (block 40). Specifically, tables may be generated for each field, with each table storing the unique patterns for its corresponding field. Thus in the example embodiment, each of the 2396 unique patterns found for the first 35 bits was assigned to entries in a table. Specifically, each pattern in the example embodiment was assigned an entry designated (addressed) by a 12-bit identifier (i.e., pointer). Thus the unique patterns may be stored in a table, indexed by the 12-bit value corresponding to that field. Similarly, a unique 13-bit identifier was associated with each unique pattern of the remaining 36 bits of the UOP to assign the patterns to entries in a table for that field.

After the tables have been generated, the words to be stored in the memory may be transformed into pointer sequences (block 50). That is, sequences of indexes into the tables may be generated for each word. In other words, the sequences are a compressed representation of the words (or fields forming the words). These pointer sequences may be stored in a separate array. Accordingly, a memory structure results that includes an array of pointers and one or more tables that store the unique patterns.

Figure 2:
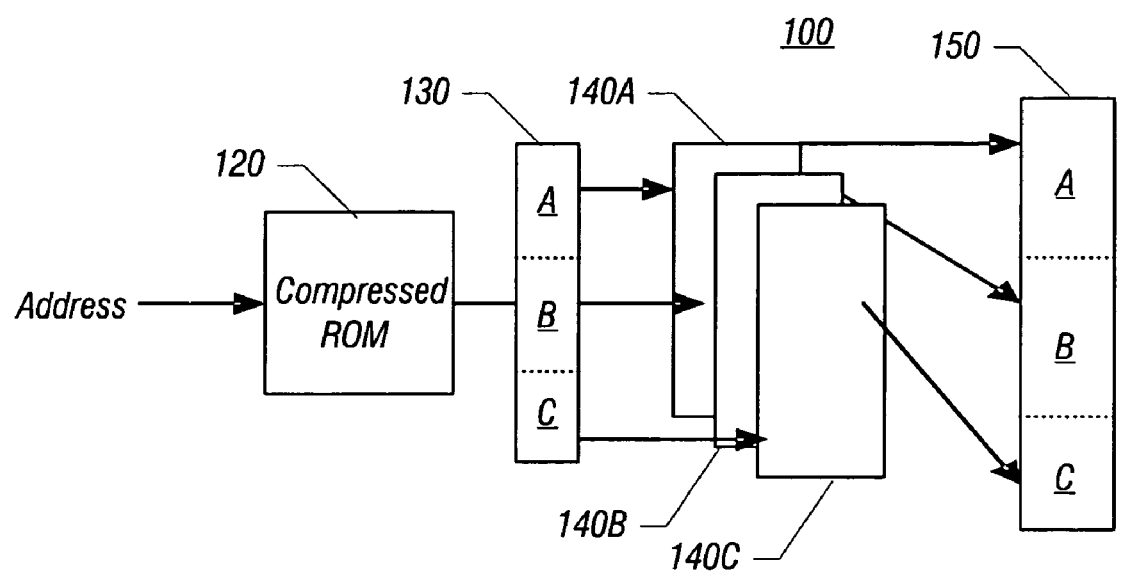
FIG. 2 is a block diagram of a memory in accordance with one embodiment of the present invention.

Referring now to FIG. 2, shown is a block diagram of a memory device 100 in accordance with an embodiment of the present invention. Specifically, memory device 100 is a microcode ROM (UROM), however in other embodiments, memory device 100 may be any type of ROM or other memory. As shown in FIG. 2, memory device 100 includes a first array 120 that is coupled to receive incoming addresses. As an example, the incoming addresses may be addresses of microcode instructions stored in memory device 100.

First array 120 may be a compressed ROM that includes entries having pointers to a plurality of second arrays or tables 140A–C. While shown with three such second tables in the embodiment of FIG. 2, it is to be understood that the scope of the present invention is not so limited and any desired number of second tables may be present, from a single table to any number of multiple tables.

The incoming address to first array 120 is used to access a desired entry in first array 120. Each entry in first array 120 includes a sequence of pointers to access second tables 140A–C. That is, each entry in first array 120 may include a pointer to each of second tables 140A–C. Thus as shown in FIG. 2, the output of first array 120 includes three pointers, namely pointers 130A–C. Each of the sequence of pointers is used to address a location within one of the second tables 140A–C.

Second tables 140A–C store unique patterns. In the embodiment of FIG. 2, each table stores unique patterns corresponding to a given field of the microcode words. In some embodiments, each of second tables 140A–C may be arranged to reduce memory loading, as will be described below. The outputs of second tables 140A–C are thus the uncompressed data 150A–C, which corresponds to the microinstruction word before compression. In the embodiment of FIG. 2, the uncompressed data corresponds to an uncompressed microcode word for the incoming address received by first array 120.

In some embodiments, the entries may be assigned to the tables to minimize loading on the memory. While loading may be reduced in various manners, in certain embodiments loading may be minimized by reducing the number of storage elements of a first logic state. Power consumption may be reduced by reducing the number of logic "1" bit states within a memory. For example, in embodiments used in a static ROM the number of bits set to "1" affects both static and dynamic power dissipation. That is, the fewer "1" bits set in the memory, the less power the memory consumes.

Because the entries in the pointer array designate a corresponding unique pattern in one or more second tables (storing the unique patterns), positions accessed using the least number of logic "1" bit states in the second tables may be assigned to those codewords or patterns that occur most frequently in the microcode. Thus the unique patterns may be assigned in generally decreasing order of occurrence. If the pointer array has 'N' bits, there is one position (namely, position '0') that contains no bits set. Then there are 'N' positions with only one bit set, N*(N−1)/2 positions with two bits set and so forth.

Accordingly, in embodiments in which reduced memory loading is desired, entries in the tables may be assigned based on a frequency of presence in the data to be stored. As an example, in microcode certain patterns may appear more frequently than others. Thus the unique patterns may be stored in a generally descending order by frequency of occurrence within the microcode. In such manner, a most frequently used pattern may be stored in a first location of a table (i.e., at a "zero" address of the table). A next most frequently accessed pattern may be stored in a memory location having a single logic "1" bit state and so forth. In other words, the unique patterns may be stored such that the most frequently used patterns are stored in locations addressed by a fewest number of logic "1" bit states. Accordingly, second tables 140A–C may be structured to reduce memory loading.

For example, assume that the most frequently occurring microcode pattern is the code for the operation 'ADD R1, R2, R3'. If this pattern is stored in position "0" in table 140A, all references to this pattern in array 120 will contain zeros. Then position "1" (i.e., 0001) in table 140A may be assigned to the next most frequently occurring pattern. Next position "2" (i.e., 0010) may be assigned to the next most frequently occurring pattern, and position "4" (i.e., 0100) may be assigned and so on, until position $2^{N-1}$ is reached. Then, positions with two bits set may be assigned, starting with position 3 (i.e., 0011), and so forth.

An example illustrates this approach. Consider Table 1 below, which shows a microcode program composed of four patterns ADD, SUB, MUL, and DIV.

TABLE 1

| ADD |
| MUL |
| ADD |
| ADD |
| SUB |
| DIV |
| MUL |

Table 2 lists those patterns in decreasing order of occurrence (in binary form), along with a count of the number of occurrences in the program.

TABLE 2

| ADD | 11 |
| MUL | 10 |
| SUB | 01 |
| DIV | 01 |

By assigning positions in the unique pattern table in decreasing order of occurrence, the table structure of Table 3 results. Note as the last two entries have the same number of occurrences, they could be assigned to either of the final two postions.

TABLE 3

| ADD | 00 |
| MUL | 01 |
| SUB | 10 |
| DIV | 11 |

The compressed microcode array (i.e., the pointer array) corresponding to Table 3 would contain only 5 bits set to a value of "1". By assigning the unique patterns in such manner, the number of bits set to "1" may be reduced significantly, thus reducing static power consumption. Alternately, Table 4 shows a table structure resulting from a random assignment of positions to the unique patterns.

TABLE 4

| ADD | 11 |
| MUL | 10 |
| SUB | 00 |
| DIV | 01 |

This table causes a much higher proportion of bits set to "1" (i.e., 9 bits compared to 5 bits) in the compressed microcode array, and thus correspondingly higher UROM loading and leakage costs.

Table 5 below lists the program of Table 1 encoded using the code of Table 3. As seen in Table 5, five bits of the program are set to "1" in the compressed microcode array.

TABLE 5

00
01
00
00
10
11
01

Next, Table 6 below shows the program of Table 1 encoded instead using the random assignment of codes of Table 4 above. In this embodiment, a higher proportion of "1" bits are set, namely nine. Thus by assigning positions in the unique pattern table in decreasing order of occurrence, a reduced number of "1" bit states may occur in the compressed microcode array.

TABLE 6

11
10
11
11
00
01
10

Additionally, the entries in each of second tables 140A–C may be transformed to further reduce memory loading. That is, in some embodiments the entries may be transformed to reduce the number of logic "1" bit states within the entries. Accordingly, second tables 140A–C may further include logic operators and additional transformation indicators (e.g., an inversion bit or the like) to indicate that such transformations have occurred. Thus during decompression the logic operators of second tables 140A–C perform reverse transformations for entries based on the transformation indicators.

For example, in one embodiment the number of "1's" in the memory may be reduced by adding a transformation indicator (e.g., single invert/not-invert bit) to each of the unique patterns. If a unique pattern has more "1's" than "0's", or in some embodiments two or more "1's" than "0's", then what is stored as the unique pattern is the inverted version, and the transformation indicator is set to 1. In this manner, static leakage power can be reduced at the overhead of an extra bit per unique pattern and a set of logic operators (e.g., exclusive OR (XOR) gates) to invert or not invert the unique pattern. As an example, by applying this technique to the table of Table 3, one may reduce the total number of bits set to 4. (In this case, the only entry to be inverted is the entry for 'DIV' which has the code '11'. It is inverted and stored as '00' and the extra 'invert' bit is set to "1".)

In more general terms, instead of selectively corresponding a single bit with a stored entry, an entry can be resolved into a sequence of N-bit fields. An additional field includes bits to correspond to each field to designate a Boolean function to be applied to the corresponding field of the entry.

Figure 3:
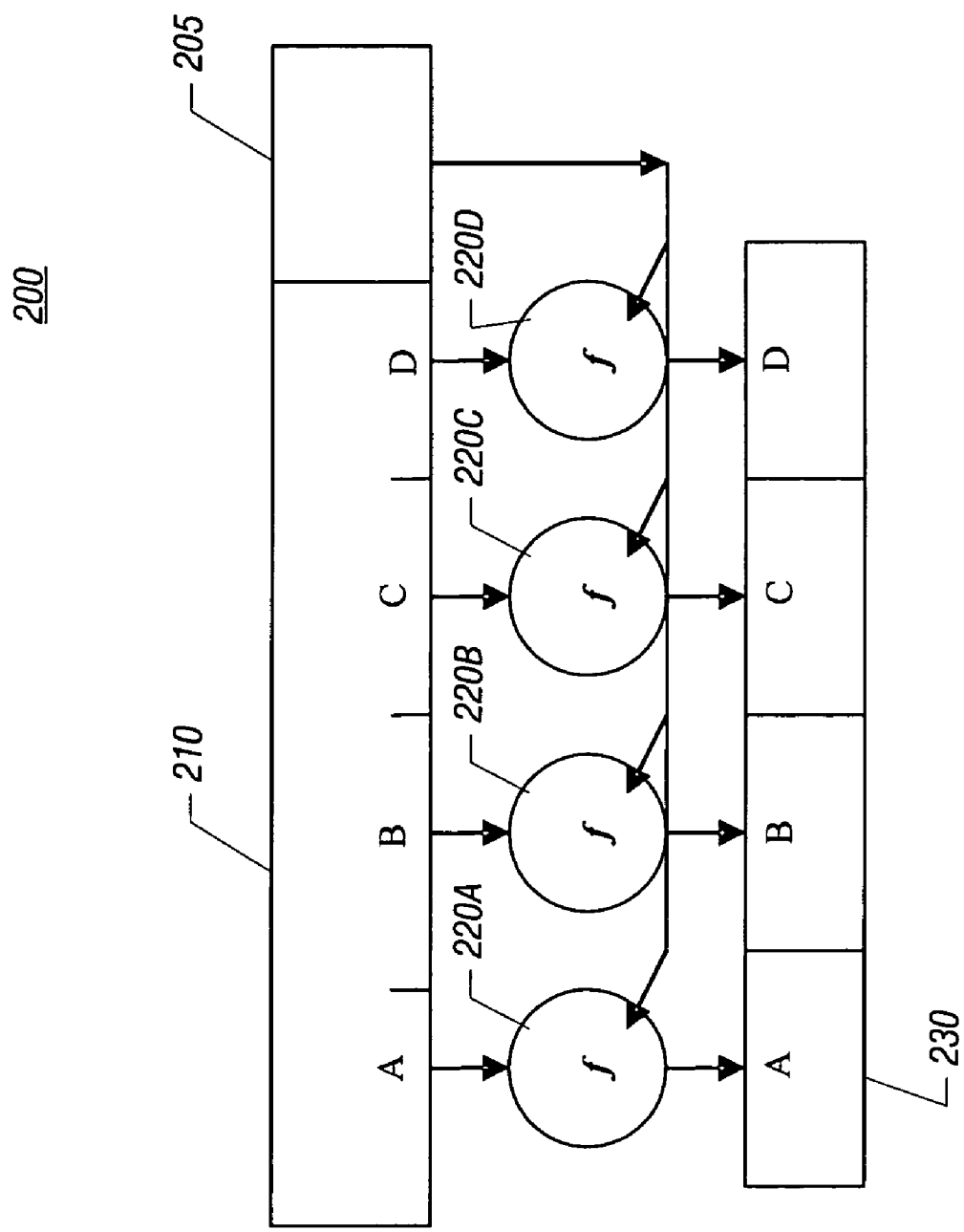
FIG. 3 is a block diagram of a portion of a memory in accordance with another embodiment of the present invention.

Referring now to FIG. 3, shown is a block diagram of a portion of a memory 200 in accordance with another embodiment of the present invention. As shown in FIG. 3, an entry 210 within memory 200 includes a plurality of fields 210A–210D. Furthermore, a transformation indicator 205 is associated with entry 210. Transformation indicator 205 may include a bit corresponding to each of the fields of entry 210. Transformation indicator 205 may identify whether a transformation was applied to a given field of entry 210 to reduce a number of logic "1" bit states within the field.

During operation, when entry 210 is accessed, each of the fields 210A–D is applied to a given one of a plurality of Boolean function operators 220A–220D. Based on the value of the corresponding bit of transformation indicator 205, function operators 220A–220D may apply reverse transformations for fields that were previously transformed. In such manner, a resulting uncompressed word 230 results, including fields 230A–D.

In such manner, a memory in accordance with an embodiment of the present invention may consume less real estate than an uncompressed memory and further may consume less power, including less leakage current and dynamic power usage. Furthermore, decompression of stored data may be simplified, thus reducing decompression hardware, further reducing power and real estate consumption. Accordingly, embodiments of the present invention may provide die area savings, particularly in processor cores that contain arrays of small cores. Also, microcode encodes key intellectual property (IP) for a device design. By storing microcode in a transformed form (e.g., encrypted), it is possible to provide further protection to the IP contained in it.

Embodiments may be implemented in a computer program. As such, these embodiments may be stored on a storage medium having stored thereon instructions which can be used to program a system to perform the embodiments. The storage medium may include, but is not limited to, any type of disk including floppy disks, optical disks, compact disk read-only memories (CD-ROMs), compact disk rewritables (CD-RWs), and magneto-optical disks, semiconductor devices such as read-only memories (ROMs), random access memories (RAMs) such as dynamic RAMs (DRAMs), erasable programmable read-only memories (EPROMs), electrically erasable programmable read-only memories (EEPROMs), flash memories, magnetic or optical cards, or any type of media suitable for storing electronic instructions. Similarly, embodiments may be implemented as software modules executed by a programmable control device, such as a computer processor or a custom designed state machine.

Figure 4:
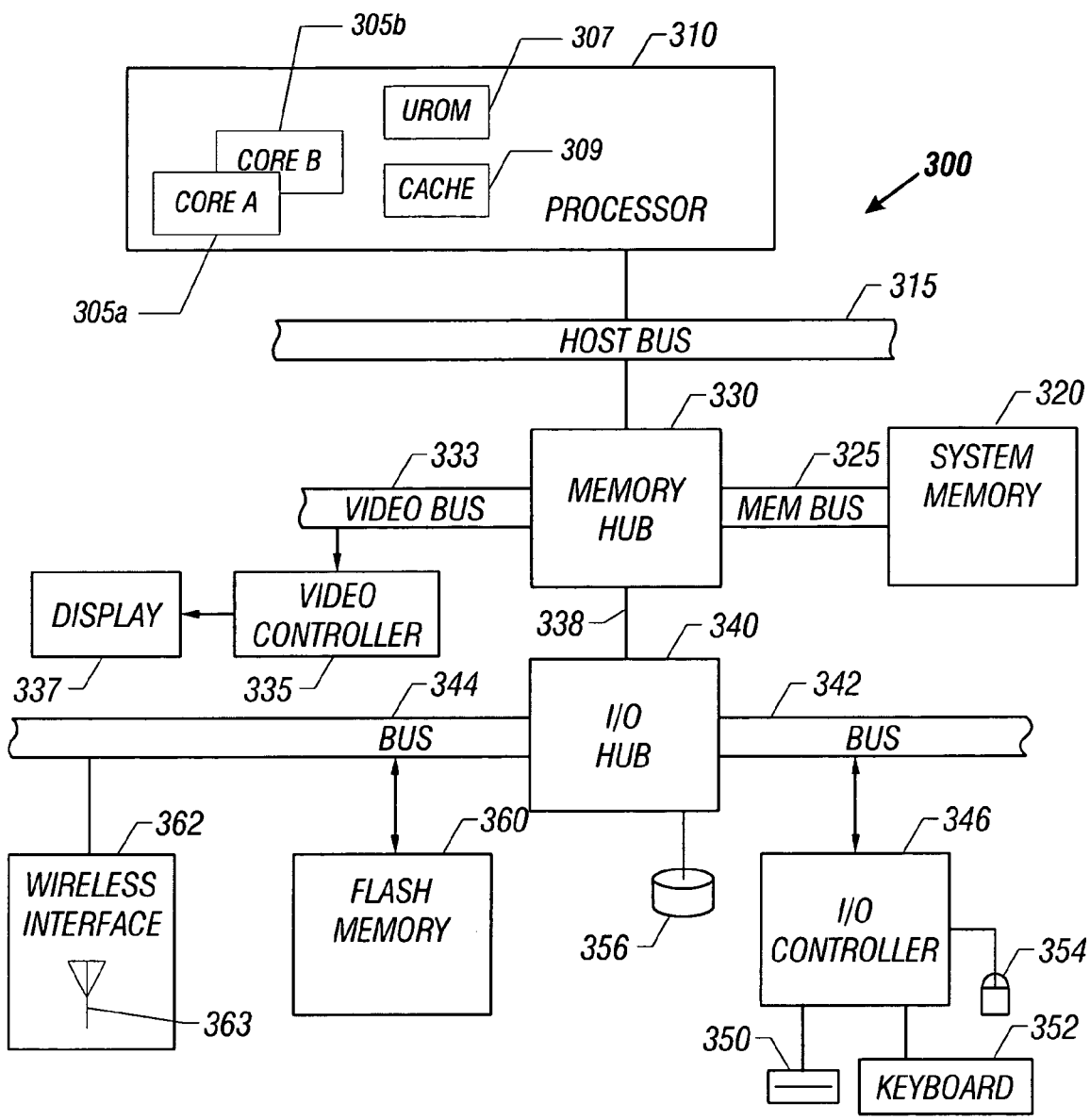
FIG. 4 is a block diagram of a system in accordance with one embodiment of the present invention.

Referring now to FIG. 4, shown is a block diagram of a system in accordance with one embodiment of the present invention. As shown in FIG. 4, system 300 includes a processor 310, which may be a general-purpose or special-purpose processor such as a microprocessor, microcontroller, application specific integrated circuit (ASIC), a programmable gate array (PGA), and the like. In the embodiment of FIG. 4, processor 310 may be a multicore processor such as a chip multiprocessor (CMP) that includes a first core 305A (i.e., core A) and a second core 305B (i.e., core B). Furthermore, processor 310 includes a UROM 307 that may be a compressed ROM in accordance with an embodiment of the present invention. More so, processor 310 includes a cache 309. While shown with the particular components in FIG. 4, it is to be understood that processor 310 may include additional components and features, based on a desired implementation. Processor 310 may be coupled over a host bus 315 to a memory controller hub (MCH) 330 in one embodiment, which may be coupled to a system memory 320 via a memory bus 325. In various embodiments, system memory 320 may be synchronous dynamic random access memory (SDRAM), static random access memory (SRAM), double data rate (DDR) memory and the like. Memory hub 330 may also be coupled over an Advanced Graphics Port (AGP) bus 333 to a video controller 335, which may be coupled to a display 337. AGP bus 333 may conform to the Accelerated Graphics Port Interface Specification, Revision 2.0, published May 4, 1998, by Intel Corporation, Santa Clara, Calif.

Memory hub 330 may also be coupled (via a hub link 338) to an input/output (I/O) controller hub (ICH) 340 that is coupled to an input/output (I/O) expansion bus 342 and a Peripheral Component Interconnect (PCI) bus 344, as defined by the PCI Local Bus Specification, Production Version, Revision 2.1 dated June 1995, or alternately a bus such as the PCI Express bus, or another third generation I/O interconnect bus.

I/O expansion bus 342 may be coupled to an I/O controller 346 that controls access to one or more I/O devices. As shown in FIG. 4, these devices may include in one embodiment storage devices, such as a floppy disk drive 350 and input devices, such as a keyboard 352 and a mouse 354. I/O hub 340 may also be coupled to, for example, a hard disk drive 356 as shown in FIG. 4. It is to be understood that other storage media may also be included in the system. In an alternate embodiment, I/O controller 346 may be integrated into I/O hub 340, as may other control functions.

PCI bus 344 may be coupled to various components including, for example, a flash memory 360. Further shown in FIG. 4 is a wireless interface 362 coupled to PCI bus 344, which may be used in certain embodiments to communicate wirelessly with remote devices. As shown in FIG. 4, wireless interface 362 may include a dipole or other antenna 363 (along with other components not shown in FIG. 4). While such a wireless interface may vary in different embodiments, in certain embodiments the interface may be used to communicate via data packets with a wireless wide area network (WWAN), a wireless local area network (WLAN), a BLUETOOTH™, ultrawideband, a wireless personal area network (WPAN), or another wireless protocol. In various embodiments, wireless interface 362 may be coupled to system 300, which may be a notebook or other personal computer, via an external add-in card or an embedded device. In other embodiments wireless interface 362 may be fully integrated into a chipset of system 300.

Although the description makes reference to specific components of the system 300, it is contemplated that numerous modifications and variations of the described and illustrated embodiments may be possible.

Figure 5:
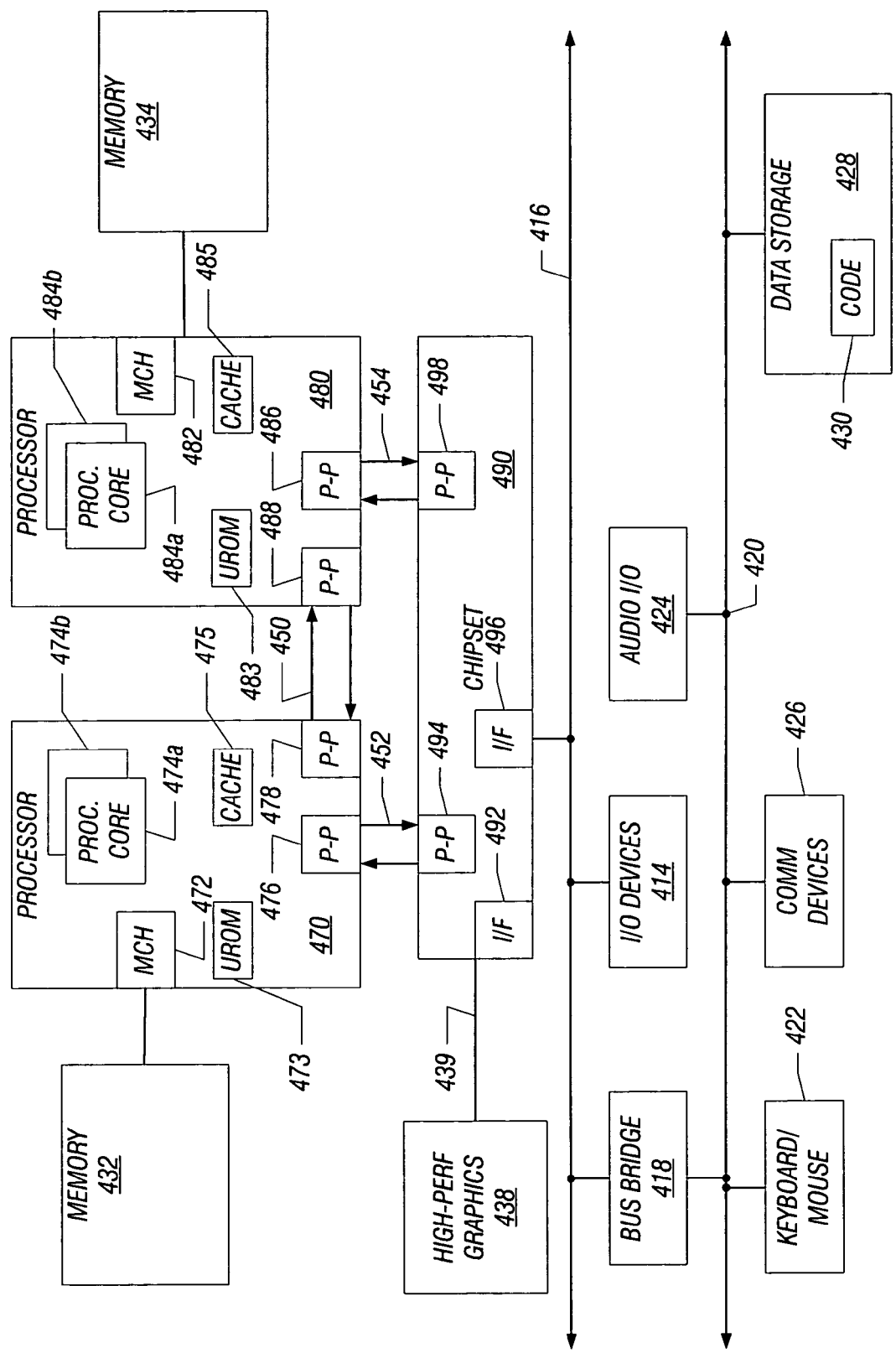
FIG. 5 is a block diagram of a multiprocessor system in accordance with another embodiment of the present invention.

For example, other embodiments may be implemented in a multiprocessor system (for example, a point-to-point bus system such as a common system interface (CSI) system). Referring now to FIG. 5, shown is a block diagram of a multiprocessor system in accordance with another embodiment of the present invention. As shown in FIG. 5, the multiprocessor system is a point-to-point bus system, and includes a first processor 470 and a second processor 480 coupled via a point-to-point interconnect 450. As shown in FIG. 5, each of processors 470 and 480 may be multicore processors, including first and second processor cores (i.e., processor cores 474a and b and processor cores 484a and b). Additionally, each processor may include a corresponding UROM (i.e., UROM 473 and UROM 483) in accordance with an embodiment of the present invention. Furthermore, each processor may include respective caches (i.e., cache 475 and cache 485). First processor 470 further includes a memory controller hub (MCH) 472 and point-to-point (P—P) interfaces 476 and 478. Similarly, second processor 480 includes a MCH 482, and P—P interfaces 486 and 488. As shown in FIG. 5, MCH's 472 and 482 couple the processors to respective memories, namely a memory 432 and a memory 434, which may be portions of main memory locally attached to the respective processors.

First processor 470 and second processor 480 may be coupled to a chipset 490 via P—P interfaces 452 and 454, respectively. As shown in FIG. 5, chipset 490 includes P—P interfaces 494 and 498. Furthermore, chipset 490 includes an interface 492 to couple chipset 490 with a high performance graphics engine 438. In one embodiment, an Advanced Graphics Port (AGP) bus 439 may be used to couple graphics engine 438 to chipset 490. AGP bus 439 may conform to the *Accelerated Graphics Port Interface Specification, Revision* 2.0, published May 4, 1998, by Intel Corporation, Santa Clara, Calif. Alternately, a point-to-point interconnect 439 may couple these components.

In turn, chipset 490 may be coupled to a first bus 416 via an interface 496. In one embodiment, first bus 416 may be a Peripheral Component Interconnect (PCI) bus, as defined by the *PCI Local Bus Specification, Production Version, Revision* 2.1, dated June 1995 or a bus such as the PCI Express bus or another third generation I/O interconnect bus, although the scope of the present invention is not so limited.

As shown in FIG. 5, various input/output (I/O) devices 414 may be coupled to first bus 416, along with a bus bridge 418 which couples first bus 416 to a second bus 420. In one embodiment, second bus 420 may be a low pin count (LPC) bus. Various devices may be coupled to second bus 420 including, for example, a keyboard/mouse 422, communication devices 426 and a data storage unit 428 which may include code 430, in one embodiment. Further, an audio I/O 424 may be coupled to second bus 420.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   segmenting each word of a code portion into a plurality of fields, wherein the code portion comprises microcode to be stored in a read only memory;
   forming tables for each of the plurality of fields, each table having a plurality of unique entries; and
   assigning one of a plurality of pointers to each of the plurality of unique entries in each of the tables.

2. The method of claim 1, further comprising forming the tables to minimize loading in a memory in which the tables are stored.

3. The method of claim 2, further comprising reducing power consumption of the memory via minimizing the loading.

4. The method of claim 2, further comprising assigning locations in the tables addressable by a lesser number of first bit states to the unique entries that occur most frequently in the code portion.

5. The method of claim 1, further comprising assigning locations in the tables in a generally decreasing order of occurrence in codewords of the code portion.

6. The method of claim 1, further comprising inverting a unique entry if the uninverted unique entry has more first bit states than second bit states.

7. The method of claim 6, further comprising storing a transformation indicator with the inverted unique entry.

8. An apparatus comprising:
a memory including a plurality of tables, each of the plurality of tables including unique entries for a field within microcode words; and
the memory including an array to store at least one sequence of pointers to access the plurality of tables.

9. The apparatus of claim 8, wherein the unique entries are to be stored in generally descending order of occurrence in the microcode words.

10. The apparatus of claim 9, wherein the generally descending order is to lower a number of first bit states in the array.

11. The apparatus of claim 10, wherein the lowered number of first bit states is to reduce power consumption of the memory.

12. The apparatus of claim 8, wherein the memory comprises a read only memory (ROM) of a processor.

13. The apparatus of claim 8, further comprising a logic operator coupled to at least one of the plurality of tables to perform a transformation on the unique entries according to a value of a transformation indicator.

14. The apparatus of claim 8, wherein the at least one sequence of pointers comprises a fixed length.

15. An article comprising a machine-readable storage medium that stores data representing an integrated circuit comprising:
a memory having a plurality of tables each including unique entries for a field of a microcode; and
the memory having an array to store a compressed representation of each field for words of the microcode.

16. The article of claim 15, wherein the integrated circuit comprises a processor.

17. The article of claim 16, wherein the memory comprises a read only memory (ROM) of the processor.

18. An article comprising a machine-readable storage medium that stores data representing an integrated circuit comprising:
a memory having a plurality of tables each including unique entries for a field of a microcode and a logic operator coupled to one or more of the plurality of tables to perform an operation on an output of the one or more of the plurality of tables according to an indicator; and
the memory having an array to store a compressed representation of each field for words of the microcode.

19. The article of claim 18, wherein the memory comprises a read only memory (ROM) of a processor.

20. A system comprising:
a first memory array to store pointer sequences;
a second memory array having a plurality of tables, each of the plurality of tables including unique entries for microcode words; and
a dynamic random access memory (DRAM) coupled to the first memory array and the second memory array.

21. The system of claim 20, further comprising a processor, wherein the first memory array and the second memory array comprise microcode storage of the processor.

22. The system of claim 20, wherein the unique entries are to be stored in generally descending order of occurrence in the microcode words.

23. The system of claim 22, wherein the first memory array is to store a lowered number of first bit states via the generally descending order.

24. The system of claim 22, wherein the generally descending order is to reduce power consumption of the first memory array.

25. The system of claim 20, further comprising a logic operator coupled to at least one of the plurality of tables to perform a transformation on the unique entries according to a value of a transformation indicator.

26. The system of claim 20, further comprising a plurality of logic operators coupled to at least one of the plurality of tables to perform transformations on a plurality of segments of the unique entries based upon a transformation indicator.

27. A method comprising:
segmenting each word of a code portion into a plurality of fields;
forming tables for each of the plurality of fields, each table having a plurality of unique entries, wherein locations in the tables are assigned in a generally decreasing order of occurrence in codewords of the code portion; and
assigning one of a plurality of pointers to each of the plurality of unique entries in each of the tables.

28. The method of claim 27, further comprising inverting a unique entry if the uninverted unique entry has more first bit states than second bit states.

29. The method of claim 28, further comprising storing a transformation indicator with the inverted unique entry.

* * * * *